(12) United States Patent
Jacques et al.

(10) Patent No.: US 11,532,764 B2
(45) Date of Patent: Dec. 20, 2022

(54) ENCAPSULANT OF A PHOTOVOLTAIC MODULE

(71) Applicant: SK GLOBAL CHEMICAL CO., LTD., Seoul (KR)

(72) Inventors: Guillaume Jacques, Elboeuf (FR); Stéphane Bizet, Barc (FR); Benoît Savignat, Bernay (FR)

(73) Assignee: SK GEO CENTRIC CO., LTD., Seoul (KR)

( * ) Notice: Subject to any disclaimer, the term of this patent is extended or adjusted under 35 U.S.C. 154(b) by 0 days.

(21) Appl. No.: 15/318,163

(22) PCT Filed: Jun. 8, 2015

(86) PCT No.: PCT/FR2015/051507
§ 371 (c)(1),
(2) Date: Dec. 12, 2016

(87) PCT Pub. No.: WO2015/193581
PCT Pub. Date: Dec. 23, 2015

(65) Prior Publication Data
US 2017/0125620 A1    May 4, 2017

(30) Foreign Application Priority Data

Jun. 18, 2014 (FR) ...................................... 1455583

(51) Int. Cl.
| | | |
|---|---|---|
| *C08L 33/08* | (2006.01) | |
| *H01L 31/048* | (2014.01) | |
| *C08L 23/08* | (2006.01) | |
| *C08K 5/5419* | (2006.01) | |
| *C08L 35/00* | (2006.01) | |
| *C08L 33/14* | (2006.01) | |
| *C09J 123/08* | (2006.01) | |
| *C08K 5/54* | (2006.01) | |
| *C08L 33/06* | (2006.01) | |

(52) U.S. Cl.
CPC ............ *H01L 31/0481* (2013.01); *C08K 5/54* (2013.01); *C08K 5/5419* (2013.01); *C08L 23/0869* (2013.01); *C08L 23/0884* (2013.01); *C08L 33/08* (2013.01); *C08L 33/14* (2013.01); *C08L 35/00* (2013.01); *C09J 123/0869* (2013.01); *C08L 33/06* (2013.01); *C08L 2203/204* (2013.01); *C08L 2203/206* (2013.01); *C08L 2205/02* (2013.01); *Y02E 10/50* (2013.01)

(58) Field of Classification Search
CPC .......... H01L 31/0481; C09J 123/0869; C08K 5/5419; C08L 33/06; C08L 33/08; C08L 33/14; C08L 35/00; C08L 23/0869; C08L 2205/02; C08L 2203/206; Y02E 10/50
See application file for complete search history.

(56) References Cited

U.S. PATENT DOCUMENTS

| | | | |
|---|---|---|---|
| 5,002,995 A | 3/1991 | Okuda et al. | |
| 6,414,236 B1 * | 7/2002 | Kataoka | H01L 31/0481 136/251 |
| 2004/0072970 A1 * | 4/2004 | Domine | C08F 210/02 526/64 |
| 2005/0159549 A1 * | 7/2005 | Kendig | B32B 27/08 525/119 |
| 2006/0160952 A1 * | 7/2006 | Chou | C08L 23/0853 525/191 |
| 2010/0126557 A1 * | 5/2010 | Chou | B32B 17/10743 136/251 |
| 2010/0269890 A1 * | 10/2010 | Koch | C08L 23/08 136/251 |
| 2011/0023943 A1 | 2/2011 | Prejean | |
| 2011/0319566 A1 | 12/2011 | Nishijima et al. | |
| 2012/0024351 A1 | 2/2012 | Prejean et al. | |
| 2012/0048354 A1 | 3/2012 | Sato et al. | |
| 2016/0027941 A1 * | 1/2016 | Watanabe | H01L 31/0481 136/256 |

FOREIGN PATENT DOCUMENTS

| | | |
|---|---|---|
| CN | 102272221 B | 9/2013 |
| EP | 0 334 205 A2 | 9/1989 |
| JP | 2011176273 A | 9/2011 |
| KR | 20110088592 A | 8/2011 |
| KR | 20110129859 A | 12/2011 |
| KR | 20120023077 A | 3/2012 |

(Continued)

OTHER PUBLICATIONS

IUPAC Compendium of Chemical Terminology, 2nd Ed., 1997, p. 1-4.*
Mishra, M.K., et al.; Handbook of Vinyl Polymers, 2008, p. 347-368.*
Mouritz, A.P.; Introduction to Aerospace Materials, 2012, Chapter 22, p. 521-533.*
International Search Report (PCT/ISA/210) dated Dec. 1, 2015, by the European Patent Office as the International Searching Authority for International Application No. PCT/FR2015/051507.

(Continued)

*Primary Examiner* — Robert S Jones, Jr.
(74) *Attorney, Agent, or Firm* — Buchanan Ingersoll & Rooney P.C.

(57) ABSTRACT

An encapsulant of a photovoltaic module, intended for coating a photovoltaic cell, having a composition which does not include any cross-linking agent and including: an ethylene—alkyl acrylate copolymer, the copolymer making up 70% to 96% of the weight of the composition; a silane, making up 0.1% to 2% of the weight of the composition; wherein the composition also includes a terpolymer of ethylene—acrylic ester—maleic anhydride or glycidyl methacrylate, the terpolymer making up 2% to 29.9% of the weight of the composition. Also relates to the use of such an encapsulant in a photovoltaic module as well as to a photovoltaic module including such an encapsulant.

7 Claims, 1 Drawing Sheet

(56) References Cited

FOREIGN PATENT DOCUMENTS

Figure 1A:
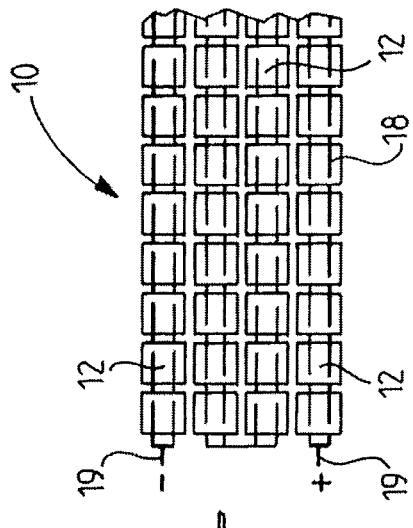

| WO | WO 2006/095911 A1 | 9/2006 |
|---|---|---|
| WO | WO 2009/136579 A1 | 11/2009 |
| WO | WO 2011/014777 A1 | 2/2011 |

OTHER PUBLICATIONS

Written Opinion (PCT/ISA/237) dated Dec. 1, 2015, by the European Patent Office as the International Searching Authority for International Application No. PCT/FR2015/051507.

Office Action (The Second Office Action) dated Aug. 19, 2019, by the State Intellectual Property Office of the People's Republic of China in corresponding Chinese Patent Application No. 201580032493.X, and an English Translation of the Office Action. (22 pages).

Office Action dated Jul. 23, 2021 by the Korean Intellectual Property Office in corresponding Korean Patent Application No. 10-2017-7001263, and an English Translation of the Office Action. (18 pages).

Grant of Patent dated Jan. 20, 2022, by the Intellectual Property Office in corresponding Korean Patent Application No. 10-2017-7001263, and a partial English Translation of the Office Action. (7 pages).

* cited by examiner

ENCAPSULANT OF A PHOTOVOLTAIC MODULE

FIELD OF THE INVENTION

The subject matter of the invention is a photovoltaic module encapsulant based on an ethylene/alkyl acrylate copolymer in which no crosslinking agent is present (peroxides or isocyanates or any other component having a crosslinking function). The present invention also relates to a photovoltaic module, or to the use of this encapsulant composition in such a module, comprising, apart from the encapsulant layer, at least one adjacent layer forming a "front sheet" or "back sheet", more generally these three successive layers: "front sheet", encapsulant and "back sheet".

Global warming, related to the greenhouse gases given off by fossil fuels, has led to the development of alternative energy solutions which do not emit such gases during the operation thereof, such as, for example, photovoltaic modules. A photovoltaic module comprises a "photovoltaic cell", this cell being capable of converting light energy into electricity.

Many types of photovoltaic panel structures exist.

A conventional photovoltaic cell has been represented in FIG. 1; this photovoltaic cell 10 comprises cells 12, a cell containing a photovoltaic sensor 14, generally based on silicon treated in order to obtain photoelectric properties, in contact with electron collectors 16 placed above (upper collectors) and below (lower collectors) the photovoltaic sensor. The upper collectors 16 of a cell are connected to the lower collectors 16 of another cell 12 via conducting bars 18, generally composed of an alloy of metals. All these cells 12 are connected to one another, in series and/or in parallel, to form the photovoltaic cell 10. When the photovoltaic cell 10 is placed under a light source, it delivers a direct electric current which can be recovered at the terminals 19 of the cell 10.

Figure 1B:
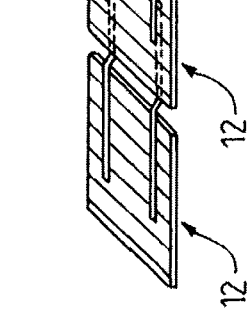
Figure 1C:
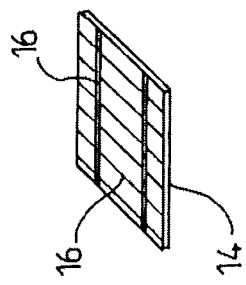
Figure 2:
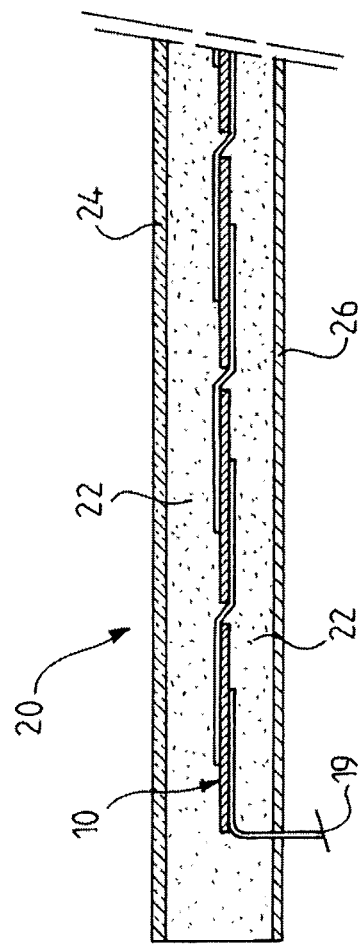

With reference to FIG. 2, the photovoltaic module 20 comprises the photovoltaic cell 10 of FIG. 1 encased in an "encapsulant", the latter being composed of an upper part 22 and of a lower part. An upper protective layer 24 (known under the term "front sheet", used in the continuation) and a protective layer at the back of the module (known under the term "back sheet", also used in the continuation) 26 are positioned on either side of the encapsulated cell.

Impact and moisture protection of the photovoltaic cell 10 is provided by the upper protective layer 24, generally made of glass.

The back sheet 26, for example a multilayer film based on fluoropolymer and on polyethylene terephthalate, contributes to the moisture protection of the photovoltaic module 20 and to the electrical insulation of the cells 12 in order to prevent any contact with the external environment.

The encapsulant 22 has to perfectly match the shape of the space existing between the photovoltaic cell 10 and the protective layers 24 and 26 in order to avoid the presence of air, which would limit the output of the photovoltaic module. The encapsulant 22 must also prevent contact of the cells 12 with atmospheric oxygen and water, in order to limit the corrosion thereof. The upper part of the encapsulant 22 is included between the cell 10 and the upper protective layer 24. The lower part of the encapsulant 22 is included between the cell 10 and the back sheet 26.

In the presence of solar radiation, heating occurs inside the solar module and temperatures of 80° C. (or more) may be reached, which necessitates that the layers be perfectly bonded to one another throughout the life cycle of the module.

STATE OF THE ART

Currently, the majority of the photovoltaic encapsulation market corresponds to formulations based on an EVA to which a peroxide, a silane and various functional additives are added.

EVA exhibits many qualities and properties advantageous for this application. This is because it confers mainly very good properties of transparency, of mechanical strength and of resistance to aging and generally excellent thermomechanical and mechanical properties. Furthermore, this thermoplastic is relatively inexpensive, so that its use for this application has become virtually inescapable.

Nevertheless, the type of encapsulant based on EVA, with peroxide and silane, exhibits two major disadvantages.

First of all, the use of a crosslinking agent, namely the peroxide, exhibits the disadvantage of relatively lengthy processing, necessary in accordance with the reactivity kinetics of the peroxide, the current cycle time, for the manufacture of a module using such an encapsulant, being between 15 and 45 minutes. Nevertheless, currently, the use of a crosslinking agent is necessary, in particular for EVA, in order to confer, on the latter, better thermomechanical properties and physicochemical characteristics and also in order to ensure the grafting of the silane to the polymer chains.

As regards the EVA, when the environmental conditions have deteriorated, that is to say when it ages under hot and damp conditions (DHT (damp heat test): 85° C./85% RH (Relative Humidity)), this component is subject to hydrolysis which brings about the appearance of acetic acid, a source of yellowing of the encapsulant and of corrosion of the metal connections of the photovoltaic module.

A person skilled in the art might envisage the replacement of the EVA by an ethylene/alkyl acrylate copolymer but this solution, although admittedly avoiding the specific problems related to EVA when the latter is present in a difficult environment, does not make it possible to obtain a correct photovoltaic module. This is because, during the lamination, numerous bubbles are formed during the crosslinking due to the peroxide, present in significant amounts.

Furthermore, the document WO 2006095911 provides a solution by the use of a formulation based on an ethylene/alkyl acrylate copolymer, the melting point of which (T in ° C.), obtained according to the standard JIS K 7121, would correspond to the following formula: $-3.0X+125>T>-3.0X+109$, the component X representing the molar content of the polar comonomer (acrylate). Furthermore, this document provides for the combining of this copolymer with a silane in order to introduce the adhesive properties on the glass.

However, such a formulation would not make it possible to obtain an encapsulant which is effective over the long term. This is because the silane exhibits the disadvantage of not making possible a good level of adhesion to the glass when it is not chemically bonded to the polymer.

Thus, an encapsulation solution based on an alternative component to EVA but exhibiting properties which are just as advantageous, while not using crosslinking agents, is currently being sought.

This solution should furthermore make possible the use of an adhesion promoter, such as a silane, making possible in particular the attachment to the walls of the front sheet, that is to say to a component made of glass-ceramic or synthetic glass (conventionally PMMA), and maintaining good adhesive properties on the front sheet during its use.

BRIEF DESCRIPTION OF THE INVENTION

It has been found, by the applicant company, after various experiments, that a composition based on an ethylene/alkyl acrylate copolymer and on silane could, without use of any crosslinking agent, exhibit highly satisfactory thermomechanical properties and physicochemical characteristics when it was combined with a functionalized polyolefin of a very specific type.

This very specific polyolefin consists of the ethylene/alkyl acrylate/maleic anhydride terpolymer.

Thus, the present invention relates to a photovoltaic module encapsulant intended to encase a photovoltaic cell, consisting of a composition not comprising any crosslinking agent and comprising:
  an ethylene/alkyl acrylate copolymer, said copolymer representing between 70% and 96% of the weight of said composition;
  a silane, representing between 0.1% and 2% of the weight of said composition;
  characterized in that it additionally comprises an ethylene/acrylic ester/maleic anhydride or glycidyl methacrylate terpolymer, said terpolymer representing from 2% to 29.9% of the weight of said composition.

The composition according to the invention first exhibits the following advantages:
  the impossibility of the appearance of acetic acid, more generally of any acid, during its use, whatever the environmental conditions;
  a very great latitude regarding the extrusion parameters of the composition film and a significant saving in time with regard to the lamination stage;
  the maintenance of excellent adhesive properties of the composition throughout the lifetime of the composition, in particular in its use as encapsulant of a photovoltaic module;
  the maintenance of excellent thermomechanical properties and of physicochemical characteristics, at least as satisfactory as the current solution based on EVA (crosslinking agent and silane).

Other characteristics and distinctive features of the primary mixture of the invention are presented below:
  advantageously, the abovesaid terpolymer represents between 8% and 22% of the weight of said composition;
  preferably, for the abovesaid copolymer, the content by weight of ethylene is between 60% and 85%, preferably between 70% and 84%, and the content by weight of alkyl acrylate is between 15% and 40%, preferably between 16% and 30%;
  advantageously, the silane consists of an epoxysilane or an aminosilane;
  in the latter case, advantageously, the silane consists of (3-glycidyloxy-propyl)triethoxysilane;
  the abovesaid copolymer is present at between 75% and 95% by weight of said composition;
  according to one possibility offered by the invention, the composition consists solely of the abovesaid copolymer, the abovesaid terpolymer and the abovesaid silane;
  according to one embodiment, the composition additionally comprises additives intended to confer additional specific properties, in particular plasticizers, adhesion promoters, UV stabilizers and absorbers, antioxidants, flame retardants and/or fillers.

The invention also relates to the use of the encapsulant as described above in a photovoltaic module.

Finally, the invention relates to a photovoltaic module comprising a structure consisting of a combination of at least one encapsulant and a front sheet or back sheet, characterized in that the encapsulant is as described above.

DESCRIPTION OF THE APPENDED FIGURES

The description which follows is given solely by way of illustration and without implied limitation with reference to the appended figures, in which:

FIG. 1, which is already described, represents an example of a photovoltaic cell, the parts (a) and (b) being ¾ views, the part (a) showing a cell before connection and the part (b) a view after connection of 2 cells; the part (c) is a top view of a complete photovoltaic cell.

FIG. 2, which is already described, represents a cross section of a photovoltaic module, the "conventional" photovoltaic sensor of which is encapsulated by an upper encapsulant film and a lower encapsulant film.

DETAILED DESCRIPTION OF THE INVENTION

As regards the ethylene/alkyl acrylate copolymer, it is a component well known to a person skilled in the art. The distinctive features specific to this copolymer, in the context of the present invention, originate essentially from the proportions by weight of ethylene and alkyl acrylate, the content by weight of ethylene being between 60% and 85%, preferably between 70% and 84%, and the content by weight of alkyl acrylate being between 15% and 40%, preferably between 16% and 30%. This copolymer will preferably be obtained according to a "tubular" polymerization process, making it possible to obtain a copolymer having improved thermal properties (in comparison with the same copolymer obtained according to the "autoclave" process).

As nonlimiting example, the applicant company makes use commercially of a component known as LOTRYL®, which is an ethylene/alkyl acrylate copolymer.

A person skilled in the art fully knows how to produce/manufacture such a copolymer, according to the different amounts of each of the two monomers. In the continuation, the invention is presented with an ethylene/alkyl acrylate copolymer of specific type but it has been demonstrated by the proprietor that the encapsulant composition according to the invention meets the objectives set when the copolymer varies within the ranges of content of ethylene and of alkyl acrylate which are defined above, possibly in a slightly better way when said copolymer exhibits contents of ethylene and of alkyl acrylate which are chosen within the ranges preferred for these two monomers.

As regards the silane, these are chemical compounds which make possible the adhesion interactions between the encapsulant and the glass. Mention may be made, as examples of silane, of aminosilanes and epoxysilanes or any other silane carrying a functional group which is reactive with respect to the terpolymer. Preferably, the silane in the composition according to the invention is glycidyloxypropyltriethoxysilane. Nevertheless, equivalent or substantially equivalent results would be obtained by choosing another silane of the family of the epoxysilanes or aminosilanes.

As regards the ethylene/acrylic ester/maleic anhydride terpolymer, this reactive component is well known to a person skilled in the art and it does not present any difficulties for its manufacture/preparation.

The composition forming the encapsulant according to the invention can comprise a certain number of additives intended to confer additional specific properties.

Plasticizers can be added in order to facilitate the processing and to improve the productive output of the process for the manufacture of the composition and of the structures. Mention will be made, as examples, of paraffinic, aromatic or naphthalenic mineral oils, which also make it possible to improve the adhesiveness of the composition according to the invention. Mention may also be made, as plasticizer, of phthalates, azelates, adipates or tricresyl phosphate.

Adhesion promoters, although not necessary, can advantageously be added in order to improve the adhesiveness of the composition when the adhesiveness has to be particularly high. The adhesion promoter is a nonpolymeric ingredient; it can be organic, crystalline, inorganic and more preferably semiinorganic semiorganic. Mention may be made, among these, of titanates.

In this specific application of the composition with photovoltaic modules, as UV radiation is capable of resulting in a slight yellowing of the composition used as encapsulant of said modules, UV stabilizers and UV absorbers, such as benzotriazole, benzophenone and other hindered amines, can be added in order to ensure the transparency of the encapsulant during its lifetime. These compounds can, for example, be based on benzophenone or on benzotriazole. They can be added in amounts of less than 10% by weight of the total weight of the composition and preferably from 0.05% to 3%.

It will also be possible to add antioxidants in order to limit the yellowing during the manufacturing of the encapsulant, such as phosphorus-based compounds (phosphonites and/or phosphites) and hindered phenolic compounds. These antioxidants can be added in amounts of less than 10% by weight of the total weight of the composition and preferably from 0.05% to 3%.

Flame retardants can also be added. These retardants can be halogenated or nonhalogenated. Among the halogenated retardants, mention may be made of brominated products. Use may also be made, as nonhalogenated retardant, of phosphorus-based additives, such as ammonium phosphate, polyphosphate, phosphinate or pyrophosphate, melamine cyanurate, pentaerythritol, zeolites and the mixtures of these retardants. The composition can comprise these retardants in proportions ranging from 3% to 40%, with respect to the total weight of the composition.

It is also possible to add pigments, such as, for example, titanium dioxide, dyeing compounds or brightening compounds in proportions generally ranging from 5% to 15%, with respect to the total weight of the composition.

Fillers, in particular inorganic fillers, can also be added to improve the thermomechanical strength of the composition. Examples which will be given are, without implied limitation, silica, alumina or calcium carbonates or carbon nanotubes or also glass fibers. Use may also be made of modified or nonmodified clays which are mixed at the nanometric order; this makes it possible to obtain a more transparent composition.

Preparation of the Encapsulant and Production of an Encapsulant Film According to the Invention (Intended to be Incorporated in a Photovoltaic Module):

Conventionally, a crosslinking is necessary in order to adjust the thermomechanical properties of the EVA-based encapsulant, in particular when the temperature becomes very high. In this case, in the context of the present invention, the crosslinking is not necessary and only conventional chemical interactions and reactions take place between the functionalized polyolefin (the terpolymer) and the ethylene/alkyl acrylate copolymer and between the functionalized polyolefin and the silane.

With regard to the aspects targeted above, the handbook entitled "Handbook of Polymer Foams and Technology", in particular on pages 198 to 204, provides additional instructions to which a person skilled in the art may refer.

As regards the aspects of the invention relating to the use of the thermoplastic composition in a photovoltaic module, a person skilled in the art may refer, for example, to the "Handbook of Photovoltaic Science and Engineering", Wiley, 2003. This is because the composition of the invention can be used as encapsulant or encapsulant-back sheet in a photovoltaic module, the structure of which is described in connection with the appended figures.

Materials Employed to Form the Formulations Tested:

Lotryl® 20MA08: ethylene/methyl acrylate copolymer, the acrylate content of which is 20% by weight of the copolymer and the MFI of which is 8 g/10 min (190° C., 2.13 kg). It can be obtained according to:
  a tubular process: Melting point=96° C.
  an autoclave process: Melting point=75° C.
In the tables of results presented below, this Lotryl® is denoted by the initials 20MA08T when it was obtained by the tubular process and 20MA08A when it was obtained by the autoclave process.

Lotryl® 24MA02: ethylene/methyl acrylate copolymer, the acrylate content of which is 24% by weight of the copolymer and the MFI of which is 2 g/10 min (190° C., 2.13 kg). It can be obtained according to:
  a tubular process: Melting point=93° C.
  an autoclave process: Melting point=68° C.
In the tables of results presented below, this Lotryl® is denoted by the initials 24MA02T when it was obtained by the tubular process and 24MA02A when it was obtained by the autoclave process.

Lotader® 3410: ethylene/butyl acrylate/maleic anhydride terpolymer, the acrylate content of which is 17% by weight of the terpolymer, the anhydride content of which is 3.1% by weight of the terpolymer and the MFI of which is 5 g/10 min (190° C., 2.13 kg). In the tables of results presented below, this Lotader® is denoted by the term 3410.

Dynasylan® GLYEO: glycidyloxypropyltriethoxysilane sold by Evonik. It is a silane having a reactive epoxide functional group and a hydrolyzable triethoxysilyl group. In the tables of results presented below, this silane is denoted by the initials GLYEO.

Evatane® 3345PV: ethylene/vinyl acetate copolymer, the acetate content of which is 33% by weight of the copolymer and the MFI of which is 45 g/10 min (190° C., 2.13 kg). In the tables of results presented below, this Evatane® is denoted by the initials 3345PV.

Dynasylan® MEMO: 3-MethacryloyloxypropylTrimethoxySilane sold by Evonik. In the tables of results presented below, this silane is denoted by the initials MTS.

Luperox® TBEC: OO-tert-butyl O-(2-ethylhexyl) monoperoxycarbonate sold by the applicant Arkema, denoted TBEC in the continuation.

Production of the Tested Films and Formulations:
  Preparation of the Films:
  The encapsulant films are obtained by extrusion of impregnated polymer granules: the silanes and, if appropriate, the peroxide are added by impregnation of the Lotryl or Evatane granules. Granules and liquid are placed in a flask and the flask is positioned on a roll mixer for approximately 3 hours at a speed of 60 rotations per minute.

After impregnation, these granules, and also optionally additional granules, are placed in the introduction hopper of a slit extruder with a width of 10 cm (centimeters).

The extrusion is carried out at a temperature appropriate to the composition; thus, for the counterexample based on Evatane and Luperox TBEC (composition EC1), this temperature is limited to 90° C., as, above this temperature, the peroxide would decompose.

In the case of formulations as described in this invention, the temperature is limited only by the thermal properties of the polymer used. However, it will be appropriate to carry out this extrusion at a temperature of between 100° C. and 220° C.

This extrusion makes it possible to obtain a reel of film, the drawing of which at the extruder outlet is adjusted so as to obtain a film with a thickness of between 350 and 550 µm (micrometers).

Preparation of the Test Modules:

In order to characterize the formulations, test modules are obtained by hot lamination.

The structure of a test module varied according to the characterizations to be carried out:

Measurement of creep and of optical properties by transmission: Glass (4 mm)/Encapsulant film/Glass (4 mm)

Measurement of optical properties by reflection: Glass (4 mm)/Encapsulant film/KPK back sheet (PVDF/PET/PVDF)

Measurement of adhesion: Glass (4 mm)/Encapsulant film/Apolhya back sheet

The laminator used is provided by Penergy. The lamination conditions (Duration, Temperature T and Pressures of the upper and lower chambers, respectively $V_{up}$ and $V_{down}$) are dependent on the composition of the laminated films.

Thus, in the case of a "conventional" formulation, the cycle observed is the following (total duration: 20 minutes):

|  | Duration (s) | T (° C.) | $V_{up}$ (mbar) | $V_{down}$ (mbar) |
| --- | --- | --- | --- | --- |
| Prestart | 10 | 85 | 0 | 1000 |
| 1 | 10 | 85 | 0 | 0 |
| 2 | 180 | 85 | 0 | 0 |
| 3 | 10 | 85 | 900 | 0 |
| 4 | 10 | 85 | 1000 | 0 |
| 5 | 600 | 150 | 1000 | 0 |
| 6 | 360 | 150 | 1000 | 0 |
| 7 | 10 | 150 | 0 | 0 |
| 8 | 10 | 150 | 0 | 0 |
| 9 | — | 50 | 0 | 1000 |

In the case of a formulation as described in the present invention, the cycle observed is the following (total duration: 8 minutes):

|  | Duration (s) | Temperature (° C.) | $V_{up}$ (mbar) | $V_{down}$ (mbar) |
| --- | --- | --- | --- | --- |
| Prestart | 10 | 150 | 0 | 0 |
| 1 | 300 | 150 | 0 | 0 |
| 2 | 10 | 150 | 1000 | 0 |
| 3 | 150 | 150 | 1000 | 0 |
| 4 | 10 | 150 | 0 | 1000 |
| 5 | — | 150 | 0 | 1000 |

Tests Carried Out on the Test Specimens:

The present invention is illustrated in more detail by the following nonlimiting examples.

The compositions denoted E1, E2, E3 and E4 in the table below are compositions in accordance with the invention while the compositions EC1, EC2, EC3 and EC4 are compositions according to the prior art and/or not in accordance with the present invention.

|  | Constituent 1 | Content 1 (%) | Constituent 2 | Content 2 (%) | Constituent 3 | Content 3 (%) |
| --- | --- | --- | --- | --- | --- | --- |
| E1 | 20MA08T | 72.75 | 3410 | 27 | GLYEO | 0.25 |
| E2 | 24MA02T | 79.75 | 3410 | 20 | GLYEO | 0.25 |
| E3 | 20MA08T | 79.75 | 3410 | 20 | GLYEO | 0.25 |
| E4 | 20MA08T | 89.75 | 3410 | 10 | GLYEO | 0.25 |
| EC1 | 3345PV | 98.2 | TBEC | 1.5 | MTS | 0.3 |
| EC2 | 20MA08T | 98.75 | 3410 | 1 | GLYEO | 0.25 |
| EC3 | 20MA08T | 59.75 | 3410 | 40 | GLYEO | 0.25 |
| EC4 | 20MA08A | 79.75 | 3410 | 20 | GLYEO | 0.25 |

The examples of the composition according to the invention all exhibit the same thicknesses but it is clearly understood that a person skilled in the art can vary them as a function of the application of the photovoltaic module and of the performance of the latter.

It will also be noted that the test specimens targeted above exhibit identical amounts of silane, fixed substantially at 0.25% of the weight of the composition. Nevertheless, additional tests have made it possible to identify that the amount of silane in the composition could be represented between 0.1% and 2% by weight of said composition.

Aging of the Structures:

An accelerated aging of the structures is carried out by DHT ("Damp Heat Test"). All the structures are placed in a climate-control chamber regulated at 85° C. and 85% RH (relative humidity). This aging lasts 2000 hours. The change in the yellowness index (YI) of the modules is monitored during this DHT.

Measurement of the Yellowness Index YI:

The yellowness index YI is measured on glass/encapsulant/back sheet structures using a spectrocolorimeter of the Minolta brand and according to the standard ASTM E313. The back sheet used for this measurement is a KPK (PVDF/PET/PVDF). The measurement conditions are as follows:

Wavelength: 360 nm-740 nm (nanometers)

Illuminant: C

Angle: 2°

Measurement opening: MAV 8 mm (millimeters)

Background: "Cera" white sheet

The value selected for this test is the change in the YI, denoted ΔYI, after aging for 2000 h under DHT conditions.

$$\Delta YI = YI_{2000h} - YI_{0h}$$

Creep Test:

The creep test is carried out on glass/encapsulant/glass structures (with glass sheets having a length L=70 mm). After lamination, the test modules are placed on a metal structure forming an angle of 70° with the horizontal. Each module is held back by an edge covering a portion of the thickness of the first glass layer.

This structure is placed in an oven at 100° C. Creep may be observed under the weight of the second glass layer. The creep value measured is thus the distance traveled by the second glass sheet after 500 hours under these conditions. This distance is between 0 mm (no creep) and 70 mm (complete creep, separation of the structure).

Adhesion Test on a Glass Sheet:

The level of adhesion between the encapsulant and the glass is measured on glass/encapsulant/back sheet structures from a 90° peel test carried out at 50 mm/min (millimeters per minute) on a Zwick 1445 universal testing machine. The back sheet used for this measurement is a monolayer consisting of Apolhya® manufactured and sold by the applicant. The measurement conditions are as follows:

Rate of displacement of the crosspiece: 50 mm/min

Test specimen cut-out width: 10 mm

Peel angle: 90°

The adhesion result is expressed in N/mm.

Tests on the encapsulant were also carried out in order to confirm that this novel structure retains excellent properties, that is to say identical properties, relative to the properties of an encapsulant in accordance with that described in the document WO 09138679, namely in particular relating to its transparency, its haze, its mechanical, thermomechanical and fire retardant properties and its electrical insulation properties. These tests proved to be positive.

The compositions according to the invention thus meet the criteria to be able to be very advantageously used as binder or encapsulant in solar modules.

Results of the Tests Carried Out On the Test Specimens of the Different Formulations:

| Test | ΔYI (DHT2000h) | Adhesion (N/mm) | Creep (mm) |
|---|---|---|---|
| E1 | 2 | 5.4 | 0 |
| E2 | 1.9 | 5.6 | 0 |
| E3 | 1.7 | 6.1 | 0 |
| E4 | 1.4 | 5.1 | 0 |
| EC1 | 6 | 6.2 | 0 |
| EC2 | 1.3 | 0.9 | 0 |
| EC3 | 2.2 | 5.7 | 8 |
| EC4 | 1.4 | 5.9 | 70 |

In the context of the present invention, the values desired with regard to the different abovementioned tests arise as follows:

the yellowness index, after 2000 hours DHT, has to be less than 3, the adhesion, for such a structure and application, has to be greater than 5 N/mm, the creep has to be less than 3 millimeters.

On the assumption that the terpolymer is present in the composition according to the invention at between 8% and 22%, the advantage obtained is a better result with regard to the creep test carried out at a temperature of greater than 100° C., typically 110° C. or more.

The invention claimed is:

1. A photovoltaic module encapsulant configured to encase a photovoltaic cell, consisting of a composition not comprising any crosslinking agent, and not comprising any peroxides or isocyanates, and comprising:
    an ethylene/methyl acrylate copolymer, said copolymer representing between 72.75% to 89.75% of the weight of said composition, wherein the ethylene/methyl acrylate copolymer is obtained by a tubular polymerization process; and
    a silane consisting of (3-glycidyloxypropyl)triethoxysilane, representing between 0.1% and 2% of the weight of said composition;
    wherein the composition further comprises an ethylene/butyl acrylate/maleic anhydride terpolymer, said terpolymer representing from 10% to 27% of the weight of said composition,
    wherein, for the terpolymer, the content by weight of the butyl acrylate is 17%, and
    wherein, for the copolymer, the content by weight of the methyl acrylate is 20% to 24%.

2. The encapsulant of claim 1, wherein the composition consists of the copolymer, the terpolymer and the silane.

3. The encapsulant of claim 1, wherein the composition further comprises additives.

4. A photovoltaic module comprising the encapsulant of claim 1.

5. A photovoltaic module comprising a structure consisting of a combination of at least one encapsulant and a front sheet or a back sheet, wherein the encapsulant is of claim 1.

6. The encapsulant of claim 1, wherein the composition further comprises additives selected from the group consisting of plasticizers, UV stabilizers and absorbers, antioxidants, flame retardants, fillers, and mixtures thereof.

7. The encapsulant of claim 1, wherein the composition further comprises titanates as nonpolymeric adhesion promoters.

* * * * *